(12) United States Patent
Oberste Berghaus et al.

(10) Patent No.: US 9,758,856 B2
(45) Date of Patent: Sep. 12, 2017

(54) (GA) ZN SN OXIDE SPUTTERING TARGET (71) Applicant: SOLERAS ADVANCED COATINGS BVBA, Deinze (BE)

(72) Inventors: Jorg Oberste Berghaus, Oudenaarde (BE); Wilmert De Bosscher, Drongen (BE)

(73) Assignee: SOLERAS ADVANCED COATINGS BVBA, Deinze (BE)

( * ) Notice: Subject to any disclaimer, the term of this patent is extended or adjusted under 35 U.S.C. 154(b) by 0 days.

(21) Appl. No.: 14/765,873

(22) PCT Filed: Feb. 4, 2014

(86) PCT No.: PCT/EP2014/052134
§ 371 (c)(1),
(2) Date: Aug. 5, 2015

(87) PCT Pub. No.: WO2014/122120
PCT Pub. Date: Aug. 14, 2014

(65) Prior Publication Data
US 2015/0368788 A1    Dec. 24, 2015

(30) Foreign Application Priority Data
Feb. 5, 2013    (EP) ..................... 13154037

(51) Int. Cl.
*C23C 14/00* (2006.01)
*C23C 14/08* (2006.01)
(Continued)

(52) U.S. Cl.
CPC .......... *C23C 14/086* (2013.01); *C04B 35/453* (2013.01); *C04B 35/457* (2013.01); *C04B 37/026* (2013.01); *C23C 14/34* (2013.01); *C23C 14/3414* (2013.01); *H01J 37/3423* (2013.01); *H01J 37/3429* (2013.01); *C04B 2235/3284* (2013.01); *C04B 2235/3286* (2013.01);
(Continued)

(58) Field of Classification Search
CPC ...................................... C23C 14/086
USPC .................... 204/192.15, 192.1, 192.22
See application file for complete search history.

(56) References Cited

U.S. PATENT DOCUMENTS 6,193,856 B1 * 2/2001 Kida .................... C23C 4/02
                                                204/192.22
6,461,686 B1 10/2002 Vanderstraeten
(Continued)

FOREIGN PATENT DOCUMENTS

CN    1369572 A    9/2002
CN    102286717 A    12/2011
(Continued)

OTHER PUBLICATIONS

International Search Report for corresponding International PCT Application No. PCT/EP2014/052134, Jul. 9, 2014.
(Continued)

Primary Examiner — Timon Wanga
(74) Attorney, Agent, or Firm — Workman Nydegger (57) ABSTRACT

A sputtering target having a one-piece top coat comprising a mixture of oxides of zinc, tin, and optionally gallium, characterized in that said one-piece top coat has a length of at least 80 cm; a method for forming such a sputtering target and the use of such a target for forming films.

14 Claims, 7 Drawing Sheets

(51) Int. Cl.
*C04B 35/453* (2006.01)
*C04B 35/457* (2006.01)
*C04B 37/02* (2006.01)
*C23C 14/34* (2006.01)
*H01J 37/34* (2006.01)

(52) U.S. Cl.
CPC .. *C04B 2235/3293* (2013.01); *C04B 2235/77* (2013.01); *C04B 2235/95* (2013.01); *C04B 2237/124* (2013.01); *C04B 2237/34* (2013.01); *C04B 2237/40* (2013.01); *H01J 2237/3322* (2013.01)

(56) References Cited

U.S. PATENT DOCUMENTS

| | | | |
|---|---|---|---|
| 6,468,402 | B1 | 10/2002 | Vanderstraeten |
| 6,511,587 | B2 | 1/2003 | Vanderstraeten |
| 7,976,738 | B2 | 7/2011 | Abe et al. |
| 8,349,220 | B2 | 1/2013 | Abe et al. |
| 8,551,370 | B2 | 10/2013 | Abe et al. |
| 2007/0215456 | A1* | 9/2007 | Abe .................... C04B 35/453 204/192.15 |
| 2011/0240934 | A1 | 10/2011 | Abe et al. |
| 2012/0312681 | A1* | 12/2012 | Yamazaki ............... C23C 14/08 204/192.1 |
| 2013/0001080 | A1 | 1/2013 | Abe et al. |

FOREIGN PATENT DOCUMENTS

| | | |
|---|---|---|
| JP | H05156431 A | 6/1993 |
| JP | H1068072 A | 3/1998 |
| JP | 2000515929 A | 11/2000 |
| JP | 2007277075 A | 10/2007 |
| JP | 2010037161 A | 2/2010 |
| JP | 2011225985 A | 11/2011 |
| JP | 2012107296 A | 6/2012 |
| WO | 9220832 A1 | 11/1992 |
| WO | 2006038538 A1 | 4/2006 |
| WO | 2009078330 A1 | 6/2009 |

OTHER PUBLICATIONS

Nikolic et al., "The Influence of Mechanical Activation on Zinc Stannate Spinel Formation," Journal of the European Ceramic Society, vol. 21, 2001, pp. 2071-2074.
Japanese Office Action from JP Application No. 2015-555746, Nov. 29, 2016.

* cited by examiner

(GA) ZN SN OXIDE SPUTTERING TARGET

TECHNICAL FIELD OF THE INVENTION

The present invention relates to the field of (Ga) Zn Sn oxide sputtering targets for producing (Ga) Zn Sn oxide thin semi-conductor films.

BACKGROUND OF THE INVENTION

Popular well established display technologies such as liquid crystal displays as well as emerging display technologies such as organic light emitting diode displays are active-matrix displays. An active matrix display comprises a matrix of thin film transistors. Polycrystalline and more recently amorphous silicon has traditionally been used as the semi-conductor channel layer of choice in active matrix displays. The main drawback of amorphous silicon however is its low charge carrier mobility (around 1 $cm^2/V\cdot s$ for electrons) which limits device performances. Alternatives are now being proposed belonging to the so-called oxide semi-conductor family. For instance, In (indium) Ga (gallium) Zn (zinc) oxides have been produced with charge mobility in the range of from 10 to 40 $cm^2/V\cdot s$. Furthermore, In Ga Zn oxides allow for homogeneous large area deposition. This makes In Ga Zn oxides the favoured oxide semi-conductor for active matrix displays of the next generation. A major drawback of In Ga Zn oxides is the fact that In is both toxic and in limited supply on earth. In is expected to be the first element where resource limitations will limit the growth of future display technologies. There is therefore a need in the art for viable Indium-free alternatives to In Ga Zn oxides. Zn Sn oxides and Zn Sn Ga oxides have been proposed as alternatives but their manufacture in acceptable quality is very challenging.

The paper "*The influence of mechanical activation on zinc stannate spinel formation*" by N. Nikolić et al. in the Journal of the European Ceramic Society 21 (2001) studies the formation of zinc stannate ceramics during treatments of compacts obtained from ZnO and $SnO_2$ powder mixtures mechanically activated in a high energy mill, and explains that zinc stannate is favourably formed by a solid state reaction during sintering with increasing time duration of high energy milling.

US20070215456A1 discloses a sintering process for the manufacture of Zn Sn oxide targets and of a Ga Zn Sn oxide sputtering target. The process involves long milling (18 hours) of the raw material, sintering in an oxygen containing atmosphere for longer than 15 hours and subsequent reduction processing by heating under non-oxidative atmosphere for longer than 7 hours to make a single sintered body. US20070215456A1 illustrates by means of examples that deviation from the preferred procedure can lead to high arcing rate of the target, and insufficient strength of the sintered body. Insufficient strength can be caused by not containing zinc stannate compound phase (or low amounts of this phase) in the sintered body. US20070215456A1 makes no mention of the length of the obtained sputter target (single sintered body) but proposes that, if necessary, several pieces of the sintered bodies may be arranged in a divided form to make a target with large area. The resistivity of the Zn Sn oxide targets was ranging from 2.3 $k\Omega\cdot cm$ to 4.7 $k\Omega\cdot cm$ and the resistivity of the Zn Sn Ga oxides target was 0.11 $k\Omega\cdot cm$. US20070215456A1 indicates that these sputtering targets could be used at a DC charge power density of 5.513 $W/cm^2$. Although these numbers compare favourably with the rest of the prior art, there remains room for much improvement. Furthermore, the sintering method at present used for the manufacture of these sputtering targets is very tedious and labour-intensive.

There is therefore a need in the art for new Indium-free alternatives to In Ga Zn oxides sputtering targets, especially for large area coatings.

SUMMARY OF THE INVENTION

It is an object of the present invention to provide good sputtering targets and methods for producing the same.

It is an advantage of embodiments of the present invention that long (Ga) Zn Sn oxide targets can be produced in one piece. For instance, one-piece (Ga) Zn Sn oxide targets can be produced having a length of 50 cm or more.

It is an advantage of embodiments of the present invention that (Ga) Zn Sn oxide targets having a top coat of low resistivity can be produced. For instance, in some embodiments, (Ga) Zn Sn oxide targets can be produced having a top coat resistivity lower than 10 $\Omega\cdot m$. In embodiments, this low resistivity can be obtained without using expensive reductive post-processing and/or without long and expensive milling of the starting powders.

It is an advantage of embodiments of the present invention that (Ga) Zn Sn oxide targets can be produced that can be used in DC sputtering or in AC sputtering having a frequency lower than 350 kHz.

It is an advantage of embodiments of the present invention that (Ga) Zn Sn oxide targets can be produced that have a homogeneous top coat It is an advantage of embodiments of the present invention that (Ga) Zn Sn oxide targets can be produced that have a homogeneous top coat consisting predominantly of zinc stannate.

It is an advantage of embodiments of the present invention that (Ga) Zn Sn oxide targets can be produced that can be used in a sputtering process at a high power density without generating an excessive arc rate. For instance, in embodiments, the sputtering process can be at a power density of at least 10 kW average DC power per meter target length.

It is an advantage of embodiments of the present invention that (Ga) Zn Sn oxide targets can be produced wherein the top coat can be applied on a carrier of various shapes. For instance, the (Ga) Zn Sn oxide targets may have a flat shape (e.g. circular or rectangular) when formed on a plate or may have a more complex form such as cylindrical when formed on a tube.

In embodiments, the carrier may be a metal carrier such as a metal (backing) tube.

It is yet another advantage of embodiments of the present invention that (Ga) Zn Sn oxide targets can be produced by a relatively simple and inexpensive method, namely thermal spray.

The above objective is accomplished by a method and device according to the present invention.

In a first aspect, the present invention relates to a sputtering target having a one-piece top coat comprising a mixture of oxides of zinc, tin, and optionally gallium, characterized in that said one-piece top coat has a length of at least 50 cm, preferably at least 65 cm, more preferably at least 80 cm, even more preferably at least 100 cm. Although it appears that the physical properties of the obtained top coats should not prevent the obtaining of any top coat length, a typical practical upper limit can in some embodiments be set at 4 m, 3 m, 2 m or 1 m. Having a one piece top coat, i.e. a top coat not consisting of 2 or more pieces (e.g. sleeves or tiles) attached together, is very advantageous as it eliminates the preferential sputtering usually observed at the frontier between top coat pieces. Such sputtering originating from the edges of the pieces leads to the formation of heterogeneous bands in the sputtered layer. A one piece top coat therefore permits a homogeneous sputtered layer. Furthermore, at these interfaces between two adjacent pieces excess arcing may occur leading to an impact on layer quality and performance.

In an embodiment of the first aspect, the proportion of Ga in said mixture of oxides relative to the total amount of Ga, Zn and Sn may be from 0 to 20 at % or from 1 to 20 at %, preferably from 3 to 15 at %, more preferably from 4 to 9 at %. The presence of Ga in the mixture of oxides of the sputtering target is advantageous because it improves electrical performances. Without being bound by theory, it is hypothesize that it suppresses the generation of oxygen vacancies in the sputtered film, which decreases the free carrier concentration and the number of electron trap sites, which can deteriorate the electrical performance of the oxide semiconductor transistor. Furthermore, it has surprisingly been found that a sputtering target having a one-piece top coat comprising a mixture of oxides of zinc, tin, and optionally gallium of at least 50 cm could be obtained by a method according to the sixth aspect of the present invention. To the best of the inventors' knowledge, such a long top coat comprising a mixture of oxides of zinc, tin and optionally gallium cannot be obtained by sintering.

In an embodiment of the first aspect, the proportion of Zn in said mixture of oxides relative to the total amount of Ga, Zn and Sn may be from 15 to 85 at %, preferably from 30 to 77 at %.

In an embodiment of the first aspect, the relative proportion of Sn may be from 15 to 55 at %

In an embodiment of the first aspect, the proportion of Zn in said mixture of oxides relative to the total amount of Ga, Zn and Sn may be from 15 to 85 at %, preferably 30 to 77 at %, more preferably from 56 to 70 at % and the relative proportion of Sn may be from 15 to 55 at %, preferably from 28 to 35 at %. This composition is advantageous because a zinc stannate oxide phase is more likely to be formed during thermal spraying, thereby making a strong and homogeneous target. Also, the creation of an amorphous thin film is facilitated in sputtering a target of this composition, leading to good transistor performance.

In embodiments of the first aspect, the mixture of oxides comprise zinc stannate oxide.

In an embodiment of the first aspect, the sum of all zinc stannate oxides in mol % present in said top coat may be higher than any other oxide present therein. For instance, if the top coat comprises also ZnO and $SnO_2$, the sum of all zinc stannate oxides in mol % may be higher than the amount of $SnO_2$ on one hand and than the amount of ZnO on the other hand. In embodiments, said zinc stannate oxides are mostly (>50 mol %) $Zn_2SnO_4$. In embodiments, said zinc stannate oxides are essentially (>90 mol % and preferably >95 mol %) $Zn_2SnO_4$. In embodiments, said zinc stannate oxides are the zinc stannate oxide $Zn_2SnO_4$. Having the sum of all zinc stannate oxides in mol % present in said top coat higher than any other oxide present therein is advantageous because the inventors could correlate the presence of zinc stannate oxides in the top coat with high top coat quality. In particular, the mechanical properties are very good, allowing long sputtering targets to be formed. Also, the density of the sputtering targets is particularly good.

In an embodiment of the first aspect, the material constitutive of said one-piece top coat has a resistivity lower than 10 $\Omega \cdot m$, preferably lower than 1 $\Omega \cdot m$, more preferably lower than 0.1 $\Omega \cdot m$, most preferably lower than $3*10^{-2}$ $\Omega \cdot m$, said resistivity being measured by a four points probe resistivity measuring device having two outer probes, said resistivity being measured on a one piece top coat of said material having a thickness of at least two times the outer probes distance of said device. This thickness requirement is not a requirement of the sputtering target itself. Rather, it is a requirement of the measurement method since a four point probe resistivity measurement on a thinner top coat may lead to inaccurate measurements. Resistivities in this range are advantageous since such low resistivities permit the use DC sputtering, pulsed DC sputtering or AC sputtering at a frequency below 350 kHz. Sputtering targets of the prior art having higher resistivities typically need to be used with RF sputtering. RF sputtering has the disadvantage when compared to DC or AC sputtering at frequency below 350 kHz that it only enables lower speed film formation, that the involved power unit is more expensive and that the film formation operation is more complicated and more difficult to control.

In embodiments said top coat may have a porosity of less than 10%, preferably less than 7%, more preferably less than 5%, even more preferably less than 3% as measured by cross-sectional SEM image analysis. This is advantageous because a denser sputtering target has a higher lifetime/volume ratio and provides better electrical and thermal conductivity. This leads to more stable sputter operation and the ability to apply higher power levels, achieving higher deposition rates.

In embodiments, said mixture of oxides may amount for at least 99 mol %, preferably at least 99.5 mol %, more preferably at least 99.9 mol % of said top coat. It is an advantage of embodiments of the present invention that a top coat of relatively low resistivity comprising a mixture of oxide of Zn, Sn and optionally Ga can be obtained despite a relatively high purity. Doping (with e.g. Al) to decrease the resistivity of Zn Sn (Ga) based sputtering targets is therefore not necessary here.

In embodiments, the sputtering target may have any shape recognized as useful in the prior art. However, a cylindrical shape is preferred because it is rotatable without creating inhomogeneities in the sputtered film, and thereby allows a high uptime due to large material depot and high target utilization as well as very low production of particles, combined with increased process stability, compared to planar sputtering sources.

In embodiments, the sputtering target may further comprise an inner backing tube, and a bond coat bonding said backing tube with said top coat.

In embodiments, said bond coat may be a metal alloy having a melting temperature higher than 200° C., preferably higher than 300° C. and more preferably higher than 400° C. In embodiments, said alloy may be a Ni alloy. Such a bond coat is advantageous as it reduces the risk of bond material related failures during sputtering. It also permits the use of higher power densities without melting the bond material. Higher power densities permits higher sputter rates.

In embodiments, the top coat has a density higher than 4 $g/cm^3$, preferably higher than 5 $g/cm^3$. A higher density assures a longer operational time for the sputtering target. Such high densities are advantageously achieved by the method of the sixth aspect.

In a second aspect, the present invention relates to a process for forming a coating on a substrate by sputtering wherein use is made of a sputtering target according to any embodiment of the first aspect. In other words, this aspect relates to the use of a sputtering target as described herein for forming a coating on a substrate by sputtering.

In embodiments, said sputtering may be a DC sputtering, a pulsed DC sputtering or an AC sputtering at a frequency below 350 kHz. This is made possible in view of the low resistivity of the sputtering targets of the first aspect.

In embodiments, said sputtering may be performed at a power density of at least 6 kW, preferably at least 10 kW, more preferably at least 14 kW and most preferably at least 18 kW average DC power per meter target length. This is a clear advantage of the present invention that such a high power density can be used. For AC sputtering, the AC power density may be selected to be equivalent with the above mentioned DC values. The latter can e.g. be determined taking into account that twice the (integrated) power level applied to a dual configuration should correspond with the average DC power density per single target.

In embodiments, the arc rate may be lower than 100 μarcs/s @18 kW/m, preferably lower than 60 μarcs/s @18 kW/m, even more preferably lower than 30 μarcs/s @18 kW/m, even more preferably lower than 10 μarcs/s @18 kW/m and most preferably lower than 6 μarcs/s @18 kW/m. Typically, it is higher than 2 μarcs/s @18 kW/m, more typically higher than 3 and even more typically higher than 4 μarcs/s @18 kW/m. For instance it can be from 3 to 7 μarcs/s @18 kW/m or from 4 to 6 μarcs/s @18 kW/m·μarc are mono-polar arcs, i.e. arcs entirely occurring on the top surface of the target material and not between the target material and another body of the coating system.

In a third aspect, the present invention relates to a substrate having a length of at least 10 cm, preferably at least 20 cm, more preferably at least 30 cm and still more preferably at least 50 cm and an amorphous semiconducting coating on a surface thereon, comprising oxides of Zn, Sn and optionally Ga. This amorphous semiconducting coating can be prepared with a target as described in the first aspect.

In embodiments, this coating can be uniform. For instance, no visible defects or non-uniformity can be observed to the naked eye.

In embodiments, said coating may have a thickness uniformity characterized by a relative standard deviation of less than 5%, preferably less than 2.5%, more preferably even less than 1.5%. In embodiments, said thickness uniformity may be measured away from the substrate edges, e.g. by excluding 1 cm all around the perimeter of the substrate.

It is an advantage of embodiments of the third aspect that a long substrate bearing a uniform coating can be obtained. In the prior art, since long one-piece Zn, Sn and optionally Ga oxide targets where particularly problematic to obtain, an obvious solution was to juxtapose side by side shorter top coats on a sputtering target. This, however has the side-effect of creating deviating properties (for example but not limited to thickness uniformity, roughness and defect density) of the coating on the substrate, especially in the area of the substrate corresponding to the area of the junction between the top coats in the sputtering target. By using the long one-piece sputtering targets according to the first aspect of the present invention, proportionally longer substrates can be coated uniformly than was previously possible. Due to plasma non-uniformity close to the edges of the sputter target, however, the length of the substrate which can be coated uniformly according to embodiments of the present invention is typically smaller than the length of the sputtering target and in any case at least 20% of the length of the sputtering target and 10 to 70 cm less than, more typically 20 to 40 cm less than the length of the sputtering target.

Hence, a sputtering target according to the first aspect measuring 50, 60, 70, or 80 cm can produce a substrate according to the third aspect which is typically 10, 20, 30 or 40 cm respectively. In any case, a sputtering target according to the first aspect measuring at least 50 cm can produce a substrate according to the third aspect which is at least 10 cm long and in most cases typically 20 cm long.

The substrate can be any substrate. For instance, it can be an insulator such as glass or plastic, a semiconductor such as a silicon wafer or a metal such as steel, all of which can be flexible or rigid.

In embodiments, in the amorphous semiconducting coating, the proportion of Ga in said mixture of oxides relative to the total amount of Ga, Zn and Sn may be from 0 to 20 at % or from 1 to 20 at %, preferably from 3 to 15 at %, more preferably from 4 to 9 at %. The presence of Ga in the mixture of oxides of the amorphous semiconducting coating is advantageous because it improves electrical performances. The proportion of Zn in said mixture of oxides relative to the total amount of Ga, Zn and Sn may be from 15 to 85 at %, preferably from 30 to 77 at %.

In an embodiment of the third aspect, the relative proportion of Sn may be from 15 to 55 at %

In an embodiment of the third aspect, the proportion of Zn in said mixture of oxides relative to the total amount of Ga, Zn and Sn may be from 15 to 85 at %, preferably from 45 to 77 at %, more preferably from 56 to 70 at % and the relative proportion of Sn may be from 15 to 55 at %, preferably from 28 to 35 at %. Also, this composition is correlated with good transistor performance.

In embodiments of the third aspect, the mixture of oxides comprise zinc stannate oxide.

In an embodiment of the third aspect, the sum of all zinc stannate oxides in mol % present in said amorphous semiconducting coating may be higher than any other oxide present therein. In embodiments, said zinc stannate oxides are mostly (>50 mol %) $Zn_2SnO_4$. In embodiments, said zinc stannate oxides are essentially (>90 mol % and preferably >95 mol %) $Zn_2SnO_4$. In embodiments, said zinc stannate oxides are the zinc stannate oxide $Zn_2SnO_4$. Having the sum of all zinc stannate oxides in mol % present in said amorphous semiconducting coating higher than any other oxide present therein is advantageous because the inventors could correlate the presence of zinc stannate oxides in the top coat with high top coat quality.

In a fourth aspect, the present invention relates to a thin film transistor comprising a substrate according to any embodiment of the third aspect.

In a fifth aspect, the present invention relates to an active matrix display device comprising a thin film transistor according to any embodiment of the fourth aspect.

In a sixth aspect, the present invention relates to a method for manufacturing a sputtering target, said method comprising the steps of:

a. Providing a mixture of oxides of zinc, tin and optionally gallium, b. Heating up said mixture to a temperature above 1000° C., preferably to a temperature between 1700° C. to 2100° C. or 1800° C. to 2100° C., c. Providing a sputtering target substrate, and d. Projecting, preferably spraying, said heated mixture onto said sputtering target substrate, thereby cooling and solidifying said heated mixture onto said sputtering target substrate.

The method according to the sixth aspect is unique in that it permits to obtain long sputtering targets. The obtainable length for the sputtering targets is at least 30 cm and in some embodiments at least 50 cm as described in the first aspect.

An aspect of the present invention is therefore a sputtering target obtainable by embodiments of the method of the sixth aspect.

To the best of the inventors' knowledge, other methods known from the prior art such as sintering, do not permit to obtain sputtering targets according to the first aspect. In particular, the top coat will not have the mechanical integrity enabling a one piece length of at least 50 cm. Even more advantageously, the sputtering target obtained in the sixth aspect of the present invention can be obtained with a low porosity.

In an embodiment, the total time taken by the sum of steps b and d may be less than 1 s.

Figure 12:
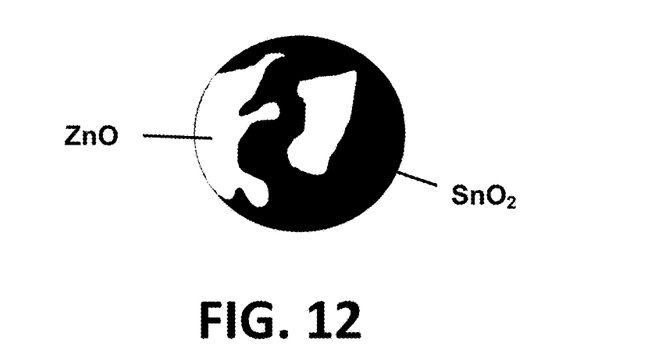
FIG. 12 is a schematic representation of a single particle comprising oxide of Zn and oxide of Sn in a same particle according to embodiments of the present invention.

In an embodiment, the method is a thermal spray method. That the targets can be produced by a thermal spray method is surprising in view of the low sublimation or decomposition temperature of Zn and Sn oxides. For instance, $SnO_2$ decomposes at approximately 1080° C. before melting at 1630° C. and ZnO sublimates at approximately 1800° C. before melting at 1975° C. These low sublimation or decomposition temperature have up to now excluded thermal spray as an effective method for forming pure Zn or Sn oxide bodies, since thermal spraying generally requires that the material to be deposited is heated at least to its melting point In an embodiment, the mixture is provided in such a way as to obtain an intimate contact of Sn and Zn oxide components during the melting phase of the thermal spraying. Thermal spraying is generally carried out with particles sufficiently large and free flowing to be delivered by a feeding system. To provide intimate contact during melting, the mixture is preferably prepared in such a way that oxides of Zn and Sn, and optionally Ga are present in single composite particles. In this embodiment, the mixture will comprise particles comprising oxides of Zn, Sn and optionally Ga within the same particle. The way the various oxides are contacting each other within a composite particle is not crucial. For instance, one oxide may form one part of a particle and another oxide may form another part of the same particle. This is schematized in FIG. 12. For instance, one oxide may be present as a coating around particles of another oxide. Another example may be a particle comprising two distinct parts of different oxide nature, bounded to each other. Yet another example may be a particle comprising one oxide forming a matrix within which islands of another oxide are dispersed.

In embodiments, the proportion of composite particles within said mixture of oxides that will be subjected to step b of the sixth aspect may be 10% or more, 20% or more, 30% or more, 40% or more, 50% or more, 70% or more or 90% or more of the particles forming said mixture.

The preparation of the mixture may for instance comprise agglomeration. Agglomeration can, for example, be done by compacting a mixture of particles of an oxide of Zn, particles of an oxide of Sn and optionally particles of an oxide Ga at a sufficient force (e.g. 80 kN), sintering these compacts, and then crushing the compacts, or by, for examples, spray-drying. The agglomeration can be done from a dry mixture or from a wet mixture such as a slurry.

The particles can be dispersed in water with the addition of a chemical binder in such a way as to obtain an intimate mixed slurry suitable for such agglomeration.

The preparation of the mixture may for instance comprise a sintering step wherein a mixture (e.g. the above agglomerated mixture) comprising oxides of Zn, oxides of Sn and optionally oxides of Ga is sintered. The sintering can for instance be performed at a temperature between 600 to 1300° C.

In embodiments, it is advantageous that at least one of the oxide particles involved in the preparation of the mixture has a diameter of less than 10 μm, preferably less than 5 μm.

An optional sieving step can also be performed in order to obtain particles having a size distribution suitable for thermal spraying.

A mixture of components in intimate contact in a particle is advantageous as it permits to obtain top coats having a better homogeneity and a better density.

In embodiment, the mixture is intimate enough to permit the formation of zinc stannate oxide in the top coat. Preferably, it is intimate enough to permit obtaining predominantly $Zn_2SnO_4$ spinel in the top coat. This does not necessarily require the presence of $Zn_2SnO_4$ in the particles themselves.

In embodiments, the backing tube of the sputtering target substrate may be roughened (e.g. via sand blasting) in order to increase the backing tube/bonding layer interface. This has the advantage to improve thermal and electrical conductivity.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

FIG. 1 (left) is a schematic representation of a cross-section of a sputtering target tube; FIG. 1 (right) shows an enlarged portion of the tube.

FIG. 9 (top) is a transmission spectrum of a film obtained by sputtering a target with the top coat of FIG. 8 according to an embodiment of the present invention. FIG. 9 (bottom) shows the same spectrum after annealing.

DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

The following terms are provided solely to aid in the understanding of the invention.

As used herein and unless provided otherwise, the term "mixture of oxides of zinc, tin, and optionally gallium" refers to a mixture of two or more oxide compounds comprising at least an oxide compound comprising zinc and at least an oxide compound comprising tin (and optionally an oxide compound comprising gallium), said oxide compound comprising zinc and said oxide compound comprising tin (and optionally said oxide compound comprising gallium) being either as numerous as there are metals (e.g. two or optionally three) or are a lesser number of oxide compounds wherein at least one oxide compounds comprises at least two metals (e.g. $Zn_2SnO_4$ or $ZnGa_2O_4$).

As used herein and unless provided otherwise, the term "zinc stannate oxide" relates to an oxide compound comprising at least zinc and tin in its composition. A typical example is $Zn_2SnO_4$ but other compounds such as non-stoichiometric compounds are included as well in this definition.

The invention will now be described by a detailed description of several embodiments of the invention. It is clear that other embodiments of the invention can be configured according to the knowledge of persons skilled in the art without departing from the invention, the invention being limited only by the terms of the appended claims.

EXAMPLES

Figure 1:
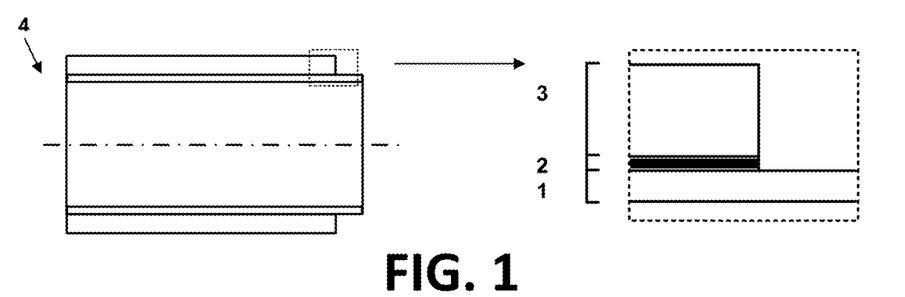

The examples 1, 2, 4, 6, and 8 below were performed by thermal spraying a mixture on a sputtering target substrate, thereby obtaining a sputtering target 4 as schematised in FIG. 1. The sputtering target substrate was composed of a backing tube 1 and a high melting point Ni alloy bond coat 2. The backing tube 1 had a relatively high roughness and the bond coat 2 had a thickness of a few hundred μm. The thermal spray process consisted in accelerating and projecting (in the present case spraying) droplets of at least partially molten oxide material onto the sputtering target substrate, where they flatten upon impact and solidify to form a coating. The feedstock powder particles are typically in the size range from 10 to 90 microns and flow freely, which allows these powders to be fed consistently into the spray apparatus while being carried by a gas, typically argon, through the feeding hoses and injectors to the apparatus. In these examples a plasma spray system was used. The plasma spray system was operated with a mixture of argon, nitrogen and hydrogen gas at a power of 40 to 90 kW. They spray system had a feed capacity of 120 g/min, Example 1

Thermal Spraying of a Simple Powder Blend of ZnO and $SnO_2$ in a Zn:Sn Atomic Ratio of 65:35

Figure 2:
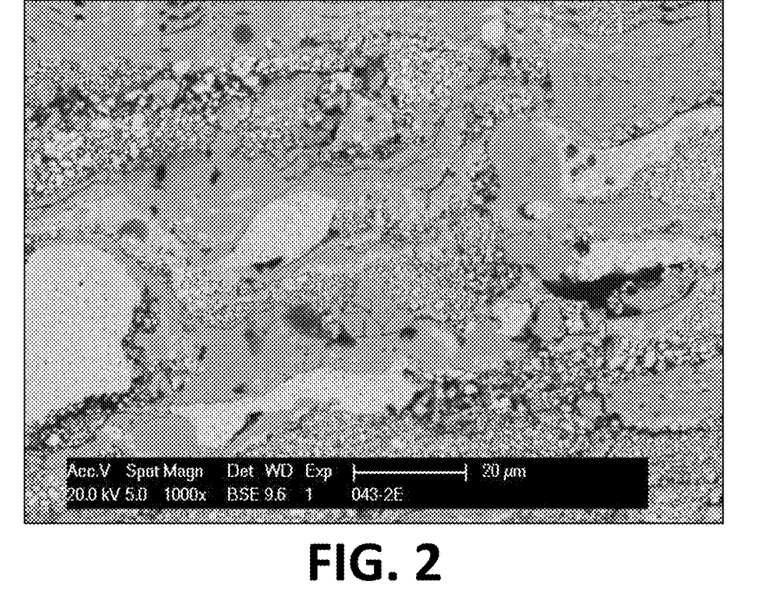
FIG. 2 is a cross-section micrograph of a top coat of a sputtering target according to an embodiment of the present invention.

Commercial spray-agglomerated and sintered pure ZnO and pure $SnO_2$ particles each with an average particle diameter of 10 to 90 microns, as measured by a Malvern particle size analyser, were blended to a Zn:Sn ratio of 65:35 at % in a rotating mixing jar for 20 min, then thermal sprayed as indicated above. Such particles for both ZnO and $SnO_2$ are typically prepared from much finer raw material powder, typically smaller than 5 microns and with a metal purity of 99.99 wt %. The small raw material particles are typically dispersed in water with the addition of a chemical binder, spray-agglomerated, sintered and then sieved to a particle size suitable for thermal spraying. FIG. 2 shows the structure of the top coat after the thermal spray procedure. The deposited $SnO_2$ particles were for the most part not molten and no $Zn_2SnO_4$ spinel was formed, as measured by X-Ray diffraction. The phase homogeneity was seen to be acceptable but non-optimal. The density of the top coat was below 4.7 g/cm$^3$, as measured by an Archimedes method, which is acceptable but not optimal either. The coating had lower strength and integrity than in the following examples but a target of 30 cm could nevertheless be made.

Example 2

Thermal Spraying of a Powder with Intimate Contacted ZnO and $SnO_2$ in a Zn:Sn Atomic Ratio of 41:59

Figure 3:
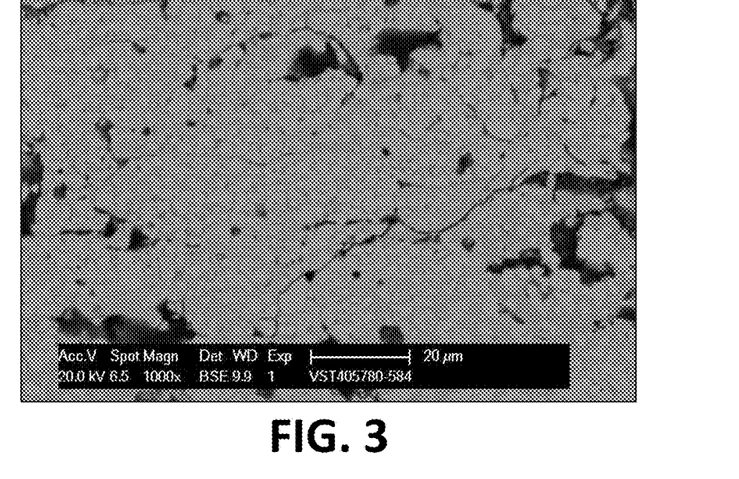
FIG. 3 is a cross-section micrograph of a top coat of a sputtering target according to an embodiment of the present invention.

Commercial spray-agglomerated and sintered $SnO_2$ powders with an average particle size of 10 to 90 microns from Example 1 were manually mixed and blended with much smaller commercial ZnO particles with an average size below 1 micrometer for 1 hour, sintered for 2 hrs and sieved to a size range of 10 to 100 microns. This procedure promoted that both Zn and Sn oxide components were present in single particles (see FIG. 12). Thermal spraying of this mixture gave a top coat comprising a Zn:Sn ratio of 41:59 at %. The strength of the obtained top coat was very good with a porosity of 8.3% and a density of at least 5.11 g/cm$^3$. Zn and Sn elements were better distributed than in Example 1, as measured by EDX elemental mapping. FIG. 3 shows the structure obtained for the top coat when the procedure comprises an intimate contact of the constituents in single particles. White micron sized $SnO_2$ particulates were uniformly dispersed in a grey matrix of zinc stannate oxide, as measured by EDX. The black regions are porosity. XRD demonstrated the presence of tin oxide and zinc stannate oxide ($Zn_2SnO_4$ spinel and other non-stochiometric species) in the top coat. No ZnO was observed in the top coat of this target. The target had a grey colour and presented parallel dark stripes. Some small pores were visible within said stripes and there were small cracks towards the ends of the target. The target had a length of 880 mm.

Conclusion on Examples 1 and 2

The quality of the mixture was shown to have a positive influence on the homogeneity, density and strength of the obtained top coat. It was also shown to have a positive influence on the formation of zinc stannate oxides such as $Zn_2SnO_4$ spinel.

Example 3

Use of Sputtering Targets from Example 2 to Produce Films on a Substrate

The sputtering target of example 2 has been used to produce sputtered films via a DC sputtering process. To test the stability of the target, sputtering was performed at 18 kW/m for more than 20 h in an oxygen-free atmosphere. The sputter process was stable. For the film production, the sputtering was performed at 18 kW/m for 1 h 20 min in an oxygen-free atmosphere. The coater opening time between two depositions was limited as much as possible. The arc rate was about 10 μarcs/s @18 kW/m. This is a low arc rate for such a high power. The maximum ramping speed used was 4 kW/min/m. The pressure during deposition was $3.0*10^{-3}$ mbar. The deposition rate was 6.5 nm per meter and per minute for a power density of one kW/m. No damages, cracks or dust formation were introduced on the target. The glass substrate was heated to 400° C. during deposition. The table below shows the properties of two samples obtained with the above procedure. In this table, "Th." stands for thickness, as measured by ellipsometry; "4 p resist." stands for electrical resistance, as measured with a four-point probe, μ is the carrier mobility, as measured from the Hall effect with a van der Pauw method; "Gr. XRD" is the phase (amorphous or crystalline) as determined by grazing angle XRD at an incident angle of 0.6°; "n" stands for refractive index; "k" stands for extinction coefficient, as measured by ellipsometry, (Sentech) from 190 nm to 2500 nm at an incident angle of 50°; "Am" stands for amorphous; and "Cr." stands for crystalline. The coatings obtained with this procedure were crystalline, which is not optimal for the use in semiconductor channel layers in thin film transistors.

| Sample | Target Zn:Sn | Th. (nm) | 4 p resist. (Ω · m) | μ (cm$^2$/Vs) | Gr. XRD | n 550 nm | k 550 nm |
|---|---|---|---|---|---|---|---|
| BAC-3 | 41:59 | 290 | $1.5 \cdot 10^{-3}$ | 5 | Cr. | 2.02 | 0.0057 |
| BAC-4 | 41:59 | 217 | $3.2 \cdot 10^{-3}$ | 4 | Cr. | 2.02 | 0.0030 |

Example 4

Thermal Spraying of $SnO_2$ Powder Blended with ZnO Powder in a Zn:Sn Ratio of 68:32

Figure 4:
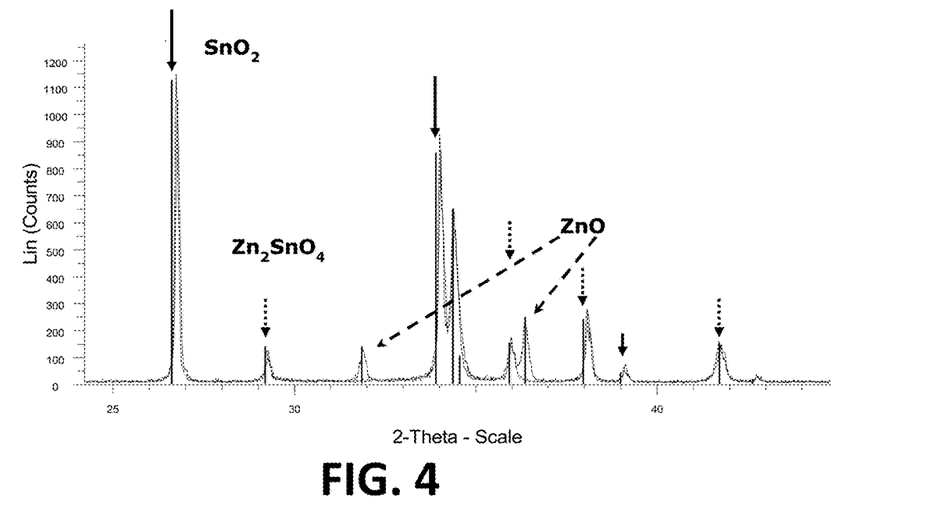
FIG. 4 is an XRD spectrum of a top coat of a sputtering target according to an embodiment of the present invention.
Figure 5:
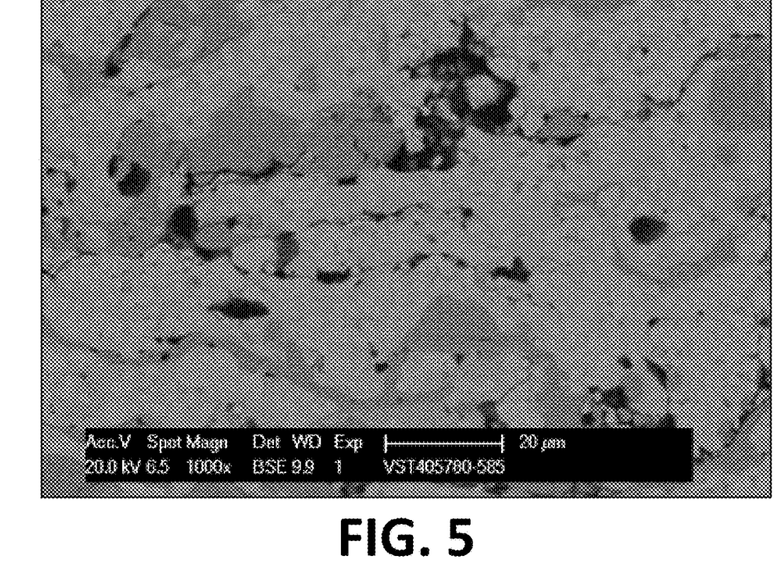
FIG. 5 is a cross-section micrograph of top coat according to an embodiment of the present invention.

$SnO_2$ particles containing ZnO components, as prepared in Example 2, were blended in a rotating mixing jar for 20 min with commercial spray-agglomerated and sintered ZnO particles with a particle size of 10 to 90 microns in such a way as to increase the overall Zn content in the blend to a Zn:Sn ratio of 68:32. Thermal spraying of this mixture gave a top coat comprising a corresponding Zn:Sn ratio. The density of the obtained top coat was at least 5.11 g/cm$^3$. The presence of tin oxide, zinc oxide and zinc stannate oxide (Zn$_2$SnO$_4$ spinel and other non-stochiometric species) in the top coat was observed (see FIG. 4). In FIG. 4, the XRD peaks indicated by a plain arrow correspond to SnO$_2$ in its cassiterite phase; the peaks indicated by a dotted arrow correspond to spinel of the Zn$_2$SnO$_4$ type (or similar but non-stochiometric species) and the dashed arrows correspond to ZnO in its hexagonal phase for the top coat in example 4. FIG. 5 shows the structure obtained for the top coat. The structure is similar to Example 2, in such that white microns sized SnO$_2$ particulates are uniformly dispersed in a grey matrix of zinc stannate, but this matrix is now interspersed with larger ZnO molten particles. The target had a grey colour and presented parallel dark stripes. Some small pores were visible within said stripes but there were no cracks. The target had a length of 880 cm.

Example 5

Use of Sputtering Targets from Example 4 to Produce Films on a Substrate

The sputtering target of example 4 has been used to produce sputtered films via a DC sputtering process analogous to example 3. To test the stability of the target, sputtering was performed at 18 kW/m for more than 20 h in an oxygen-free atmosphere. The sputter process was stable. For the film production, the sputtering was performed at 18 kW/m for more than 2 h 40 min in an oxygen-free atmosphere. The coater opening time between two depositions was limited as much as possible. The pressure during deposition was $3.0*10^{-3}$ mbar. The arc rate was about 15 μarcs/s @18 kW/m. The maximum ramping speed used was 4 kW/min/m. The deposition rate was 6.5 nm per meter and per minute for a power density of one kW/m. No damages, cracks or dust formation was observed. The glass substrate was heated to 400° C. during deposition. The table below shows the properties of two samples obtained with the above procedure. The samples produced with this procedure show high carrier mobility and are XRD amorphous, suitable for amorphous metal oxide thin film transistors.

| Sample | Target Zn:Sn | Th. (nm) | 4 p resist. ($\Omega \cdot m$) | μ (cm$^2$/Vs) | Gr. XRD | n 550 nm | k 550 nm |
|---|---|---|---|---|---|---|---|
| BAC-1 | 68:32 | 225 | $1.2 \cdot 10^{-4}$ | 26 | Am. | 2.05 | 0.0060 |
| BAC-2 | 68:32 | 223 | $1.6 \cdot 10^{-4}$ | 27 | Am. | 2.05 | 0.0062 |

Example 6

Thermal Spraying of Powder with Intimately Mixed ZnO and SnO$_2$ in a Zn:Sn Atomic Ratio of 68:32

Figure 6:
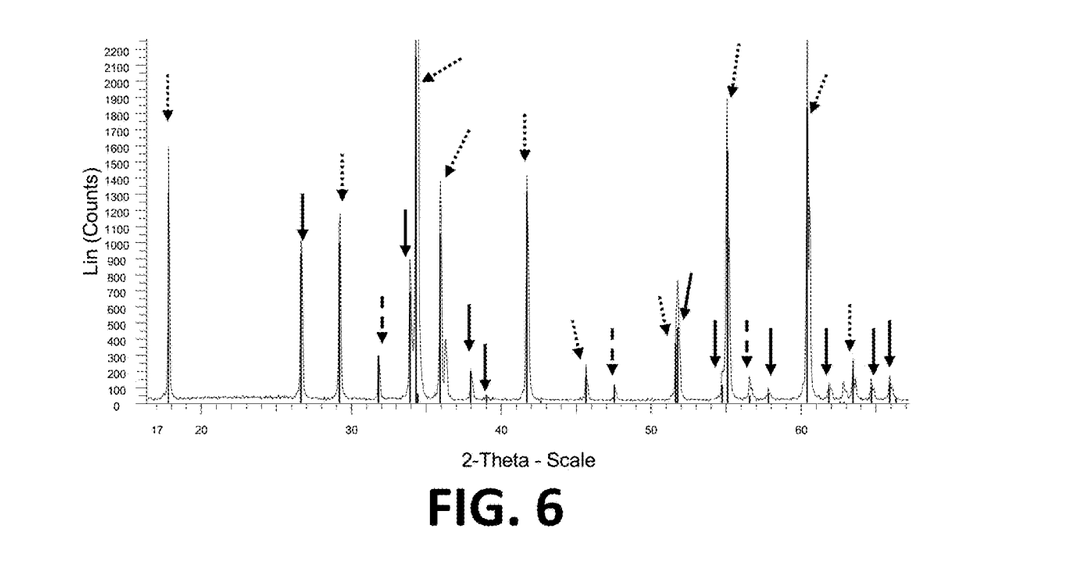
FIG. 6 is an XRD spectrum of a powder used to form a top coat according to an embodiment of the present invention.
Figure 7:
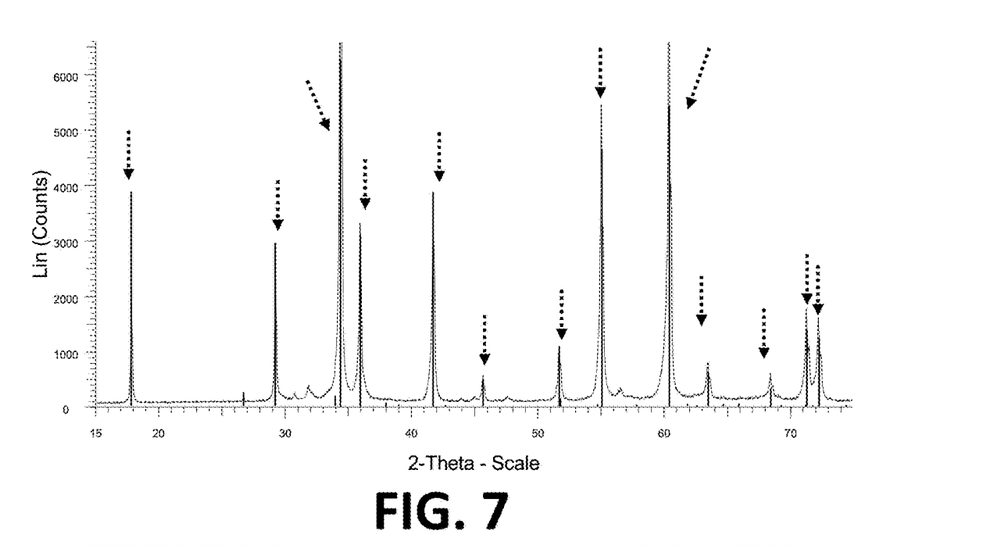
FIG. 7 is a XRD spectrum of a top coat obtained by thermal spraying the powder of FIG. 6.
Figure 8:
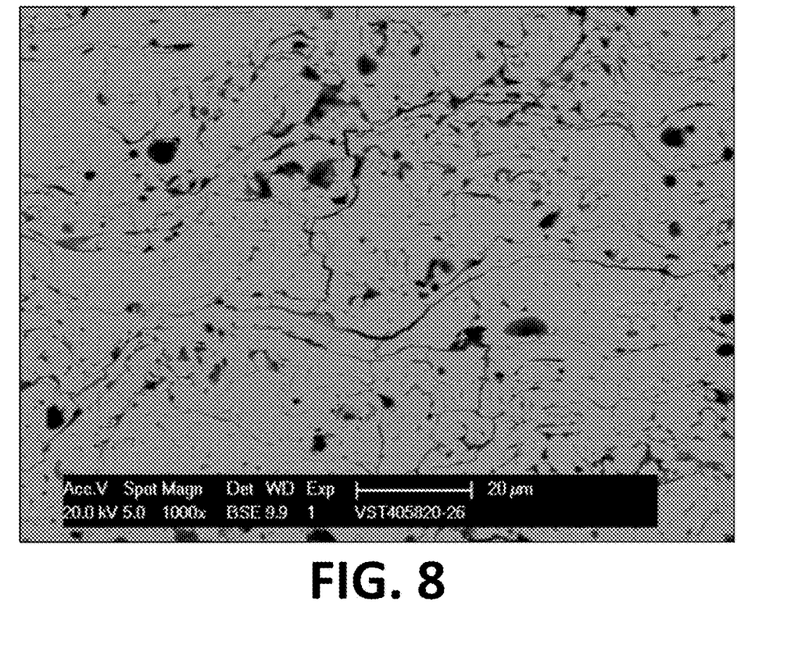
FIG. 8 is a cross-section micrograph of the top coat obtained by thermal spraying the powder of FIG. 6 according to an embodiment of the present invention.

Agglomerated and sintered powder containing ZnO and SnO$_2$ components in intimate contact within single powder particles were thermal sprayed as indicated above. The Zn:Sn ratio was 68:32. The powder had an average particle diameter of 10 to 90 microns. These thermal sprayed powders are prepared from much finer raw material smaller than 5 microns with a metal purity of 99.99 wt %. The small raw material particles are dispersed in such a way as to obtain an intimate mixture suitable for agglomeration. The resulting agglomerates are typically sintered at a temperature not exceeding 1300° C. A fraction of this powder is sieved to a particle size suitable for thermal spraying as above. Using such a procedure allows to have Zn and Sn oxide components in intimate contact within single spray particles. Zn$_2$SnO$_4$ spinel can be created during this sintering step of the powder production. For the powder in this example, FIG. 6 shows the presence of zinc stannate oxide (spinel), while it still contains significant amounts of SnO$_2$ and ZnO. This powder was used to form a top coat for a sputtering target in a way analogous to example 2. Thermal spraying of this mixture gave a top coat comprising a Zn:Sn ratio of 68:32. The phase homogeneity of the obtained top coat was very good. The density of the obtained top coat was at least 5.37 g/cm$^3$. The target had a homogeneous appearance, without stripes, pores or cracks. The target was 880 mm long. FIG. 7 shows the spectrum of the resulting top coat. It shows predominantly the presence of zinc stannate spinel with only small amounts of SnO$_2$ and ZnO. In FIG. 8, it can be seen that this top coat is more phase-homogeneous than the top coat of FIG. 5.

Example 7

Use of Sputtering Targets from Example 6 to Produce Films on a Substrate

Figure 9:
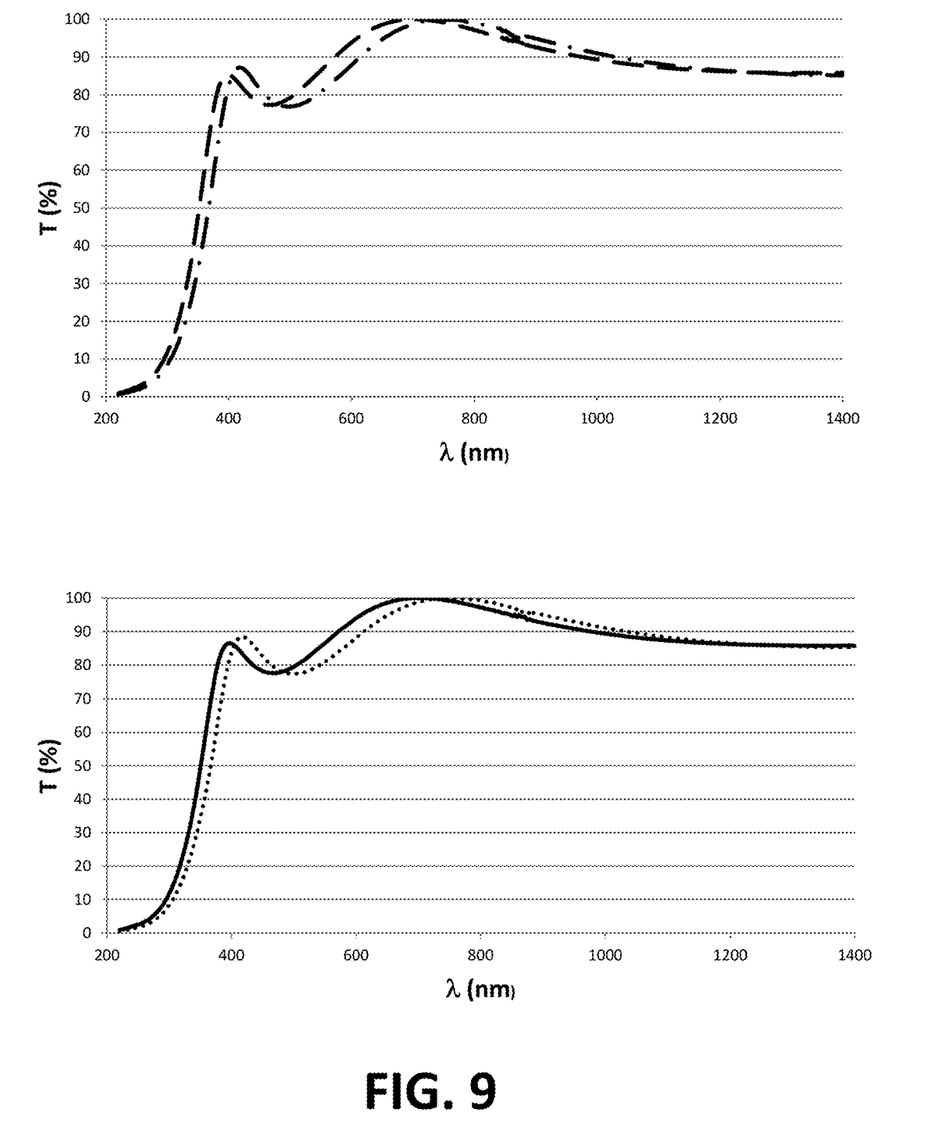

The sputtering target of example 6 has been used to produce sputtered films via a DC sputtering process analogous to example 5. To test the stability of the target, sputtering was performed at 18 kW/m for more than 20 h in an oxygen-free atmosphere. The sputter process was stable. The arc rate was about 5 μarcs/s @18 kW/m. This is a very low arc rate for such a high power. The maximum ramping speed used was 4 kW/min/m. The deposition rate was from 7 to 10 nm per meter and per minute for a power density of one kW/m. No damages, cracks or dust formation was observed. Sputtered films were then produced at power densities of 6 to 18 kW/m at a pressure of $2.10^{-3}$ to $8.10^{-3}$ mbar with oxygen in argon gas from 0 to 10%. The substrates were not externally heated during deposition. The samples were, however, post annealed in vacuum at 180° C. The table below shows the properties of two samples obtained with the above procedure. The transmission spectrum of a 180 nm thick film on glass, as measured with a spectrophotometer, is shown FIG. 9 (before (top, dashed dotted line) and after (bottom, dotted line) annealing at 180° C.). The samples had high optical transmission. The samples were XRD amorphous. The initial resistivity of the film on a Si/SiO$_2$ substrate suitable for the fabrication of TFTs was from 0.0023 to 0.013 $\Omega \cdot m$.

| Sample | Sputter Power (kW/m) | $O_2$ in Ar (%) | Arcs/ sec | Pres. (μbar) | Dep. rate (nm m/min)/ (kW/m) | Th. (nm) | 4 p resist. (Ω·m) | μ (cm$^2$/Vs) | Gr. XRD | n@550 nm |
|---|---|---|---|---|---|---|---|---|---|---|
| SAC 5-6H | 12 | 4 | 0.8 | 4 | 8.7 | 180 | $2.33 \cdot 10^{-3}$ | 18.8 | Am. | 2.05 |
| SAC 6-7H | 12 | 6 | 0.5 | 4 | 7.7 | 179 | $1.23 \cdot 10^{-2}$ | 20.57 | Am. | 2.05 |

Example 8

Thermal Spraying of a $Ga_2O_3$—ZnO—$SnO_2$ Intimate Mixture in a Ga:Zn:Sn Atomic Ratio of 7:60:33

Figure 10:
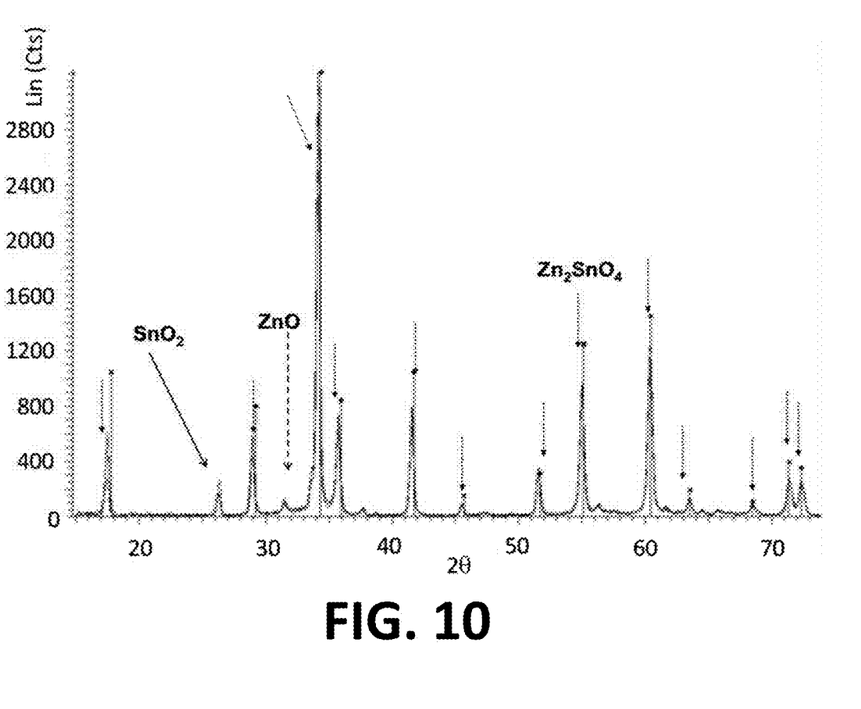
FIG. 10 is a XRD spectrum of a top coat obtained by thermal spraying according to an embodiment of the present invention.
Figure 11:
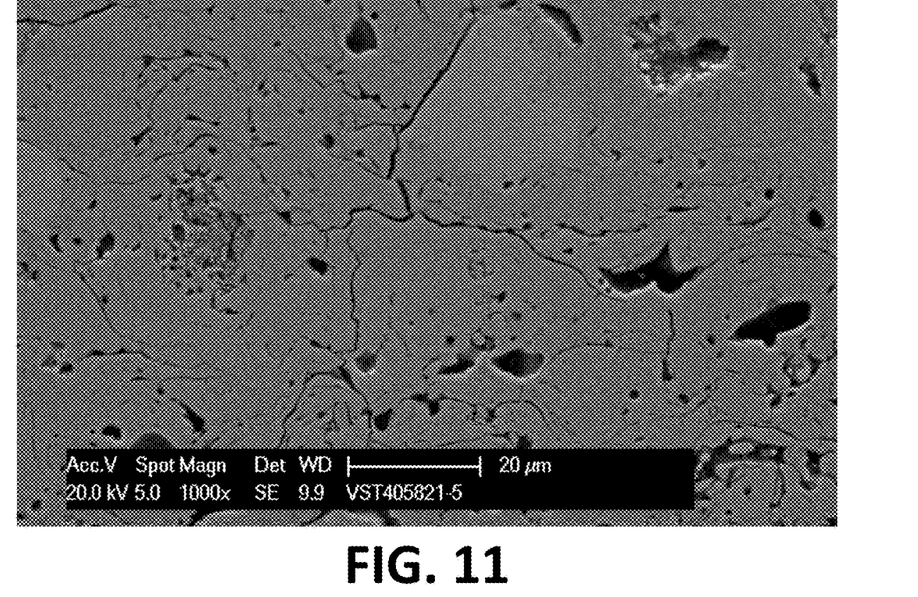
FIG. 11 is a cross-section micrograph of the top coat of FIG. 10 according to an embodiment of the present invention.

Agglomerated and sintered powder containing Zn, Sn and Ga oxide components in intimate contact within single powder particles were thermal sprayed as indicated above. The Ga:Zn:Sn ratio was 7:60:33. A typical procedure for preparation of agglomerated and sintered powder was used whereby micron-sized $Ga_2O_3$, particles were introduced into the intimate mixture for agglomeration. The sintering was typically such that the particles would not break or disintegrate. A fraction of this powder was sieved to a particle size suitable for thermal spraying as above. The inventors observed that long sintering an intimate mixture of micron-sized ZnO, $SnO_2$ and $Ga_2O_4$ particles at temperatures high enough for substantial $Zn_2SnO_4$ spinel formation breaks a sintered body or powder. Breakage would make the powder unsuitable for thermal spraying. Surprisingly, the thermal spraying of this powder having no or only a small amount of $Zn_2SnO_4$ spinel resulted in a uniform and strong top coat consisting of predominantly $Zn_2SnO_4$ spinel. The coating could be obtained with a length much larger than 50 cm and no upper limit for the length could be detected. The gallium species were well dispersed within the coating as evidenced by element mapping in cross-section micrographs. The phase homogeneity of the obtained top coat was good with predominantly $Zn_2SnO_4$ and smaller amounts of $ZnO_2$ and $SnO_2$ components. FIG. 10 shows the XRD spectrum of the obtained top coat. The Ga oxide is dissolved in the zinc stannate oxide spinel and is therefore not visible in the XRD spectrum. FIG. 11 shows a cross-sectional micrograph of the top-coat of the target. The density of the obtained top coat was at least 5.7 g/cm$^3$. The target had a macroscopically homogeneous appearance, without stripes, pores or cracks. The target was 880 mm long. The porosity was lower than 3%. The resistivity of the target was $1.94 \cdot 10^{-2}$ Ω·m.

Example 9

Use of Sputtering Targets from Example 8 to Produce Films on a Substrate

The sputtering target of example 8 has been used to produce sputtered films via a DC sputtering process analogous to example 7. To test the stability of the target, sputtering was performed at 18 kW/m for more than 20 h in an oxygen-free atmosphere. The sputter process was stable. The arc rate was less than 5 μarcs/s @18 kW/m. This is a very low arc rate for such a high power. The maximum ramping speed used was 4 kW/min/m. The deposition rate was from 7 to 10 nm per meter and per minute for a power density of one kW/m. No damages, cracks or dust formation was observed. Sputtered films were then produced at powers of 6 to 18 kW/m at a pressure of $2 \cdot 10^{-3}$ to $8 \cdot 10^{-3}$ mbar with oxygen in argon gas from 0 to 10%. The substrates were not externally heated during deposition. The samples were post annealed in vacuum at 180° C. The table below shows the properties of a sample obtained with the above procedure. The transmission spectrum of a 170 nm thick film on glass, as measured with a spectrophotometer, is shown FIG. 9 (before (top, dashed line) and after (bottom, plain line) annealing at 180° C.). The samples had high optical transmission. The samples were XRD amorphous. The initial resistivity of the film suitable for the fabrication of TFTs was from 0.02 to 0.5 Ω·m.

| Sample | Sputter Power (kW/m) | $O_2$ in Ar (%) | Arcs/ sec | Pres. (μbar) | Dep. rate (nm m/min)/ (kW/m) | Th. (nm) | 4 p resist. (Ω·m) | Gr. XRD | n@550 nm |
|---|---|---|---|---|---|---|---|---|---|
| SAC 7-4H | 12 | 4 | 0.7 | 4 | 8.1 | 171 | $2.6 \cdot 10^{-2}$ | Am. | 2.05 |

It is to be understood that although preferred embodiments, specific constructions and configurations, as well as materials, have been discussed herein for devices according to the present invention, various changes or modifications in form and detail may be made without departing from the scope and spirit of this invention. For example, any formulas given above are merely representative of procedures that may be used. Functionality may be added or deleted from the block diagrams and operations may be interchanged among functional blocks. Steps may be added or deleted to methods described within the scope of the present invention.

The work leading to this invention has received funding from the European Community's Seventh Framework Programme (FP7/2007-2013) under grant agreement n° NMP3-LA-2010-246334.

The invention claimed is:
1. A sputtering target having a one-piece top coat, the one-piece top coat having a length of at least 80 cm, the one-piece top coat further comprising a mixture of oxides of zinc, tin, and optionally gallium, wherein the mixture of oxides comprises zinc stannate oxide and the proportion of tin in said mixture of oxides relative to the total amount of gallium, zinc and tin is from 15 to 55 at %.

2. The sputtering target according to claim 1, wherein the proportion of Ga in said mixture of oxides relative to the total amount of Ga, Zn and Sn is from 3 to 15 at %.

3. The sputtering target according to claim 1, wherein the proportion of Zn in said mixture of oxides relative to the total amount of Ga, Zn and Sn is from 15 to 85 at %.

4. The sputtering target according to claim 1, wherein the sum of all zinc stannate oxides in at % present in said top coat is higher than any other oxide present therein.

5. The sputtering target according to claim 1, wherein the material constitutive of said one-piece top coat has a resistivity lower than 10 Ω·m, said resistivity being measured by a four points probe resistivity measuring device having two outer probes, said resistivity being measured on a one piece top coat of said material having a thickness of at least two times the outer probes distance of said device.

6. The sputtering target according to claim 1, wherein said top coat has a porosity of less than 10% as measured by cross-sectional SEM image analysis.

7. The sputtering target according to claim 1, wherein said mixture of oxides amounts for at least 99 at % of said top coat.

8. The sputtering target according to claim 1 having a cylindrical shape.

9. The sputtering target according to claim 1 wherein the sputtering target further comprises an inner backing tube and a bond coat bonding said backing tube with said top coat, said bond coat being a metal alloy having a melting temperature higher than 200° C.

10. A process for forming a coating on a substrate by sputtering wherein use is made of a sputtering target according to claim 1.

11. The process according to claim 10, wherein said sputtering is a DC sputtering, pulsed DC sputtering or an AC sputtering at a frequency below 350 kHz.

12. The process according to claim 10, wherein said sputtering is performed at a power density of at least 10 kW average DC power per meter target length.

13. A thermal spray method for manufacturing a sputtering target according to claim 1, said method comprising the steps of:
   a. Providing a mixture of oxides of zinc, tin and optionally gallium, the proportion of tin in said mixture of oxides relative to the total amount of gallium, zinc and tin being from 15 to 55 at % and said mixture comprising particles comprising oxides of Zn, Sn and optionally Ga, said oxides contacting each other within the same composite particle,
   b. Heating up said mixture to a temperature above 1000° C., thereby melting said mixture,
   c. Providing a sputtering target substrate, and
   d. Projecting, preferably spraying, said molten mixture onto said sputtering target substrate, thereby cooling and solidifying said molten mixture onto said sputtering target substrate.

14. A method according to claim 13, wherein the total time taken by the sum of steps b and d is less than 1 s.

* * * * *